United States Patent
Baba

(10) Patent No.: US 9,252,097 B2
(45) Date of Patent: Feb. 2, 2016

(54) SEMICONDUCTOR MEMORY DEVICE

(75) Inventor: Yasuyuki Baba, Yokkaichi (JP)

(73) Assignee: KABUSHIKI KAISHA TOSHIBA, Tokyo (JP)

(*) Notice: Subject to any disclaimer, the term of this patent is extended or adjusted under 35 U.S.C. 154(b) by 0 days.

(21) Appl. No.: 13/599,153

(22) Filed: Aug. 30, 2012

(65) Prior Publication Data

US 2013/0249113 A1    Sep. 26, 2013

(30) Foreign Application Priority Data

Mar. 22, 2012 (JP) .................................. 2012-65789

(51) Int. Cl.
*H01L 27/24* (2006.01)
*H01L 23/498* (2006.01)
(Continued)

(52) U.S. Cl.
CPC ...... *H01L 23/49844* (2013.01); *H01L 27/2409* (2013.01); *H01L 27/2418* (2013.01); *H01L 27/2481* (2013.01); *H01L 45/04* (2013.01); *H01L 45/06* (2013.01); *H01L 45/08* (2013.01); *H01L 45/085* (2013.01); *H01L 45/10* (2013.01);
(Continued)

(58) Field of Classification Search
CPC ... H01L 23/49844; H01L 45/06; H01L 45/10; H01L 45/1233; H01L 45/141; H01L 27/101; H01L 27/2418; H01L 27/2481; H01L 27/0688; H01L 27/115; H01L 27/11578; H01L 27/2409; H01L 27/2454; H01L 27/2463
USPC ........... 438/382, 482, 128; 365/148, 189.011, 365/207, 218; 257/4, 776, 208, E21.004, 257/E27.01, E47.001, E21.001, 211, 257/E29.001
See application file for complete search history.

(56) References Cited

U.S. PATENT DOCUMENTS 7,402,903 B2    7/2008  Matsuo
7,996,813 B2    8/2011  Hatano et al.
(Continued)

FOREIGN PATENT DOCUMENTS

JP    2004-228320    8/2004
JP    2006-60072     3/2006
(Continued)

OTHER PUBLICATIONS

Chinese Office Action issued Mar. 23, 2015 is Patent Application No. 201310074724.6 with English Translation.
(Continued)

*Primary Examiner* — Olik Chaudhur
*Assistant Examiner* — Bitew Dinke
(74) *Attorney, Agent, or Firm* — Oblon, McClelland, Maier & Neustadt, L.L.P.

(57) ABSTRACT

The semiconductor memory device comprises a plurality of first wiring lines extending in a first direction, a plurality of second wiring lines extending in a second direction crossing the first direction, and a memory cell array comprising memory cells, the memory cells being connected to the first wiring lines and second wiring lines in the crossing portions of the first and second wiring lines. A plurality of first dummy-wiring-line regions are formed in the peripheral area around the memory cell array. A contact is formed in the peripheral area, the contact extending in a third direction perpendicular to the first and second directions. A plurality of second dummy-wiring-line regions are formed in the periphery of the contact. The mean value of the areas of the second dummy-wiring-line regions is less than the mean value of the areas of the first dummy-wiring-line regions.

15 Claims, 10 Drawing Sheets

(51) Int. Cl.
*H01L 45/00* (2006.01)
*H01L 27/02* (2006.01)

(52) U.S. Cl.
CPC .......... *H01L 45/1233* (2013.01); *H01L 45/141* (2013.01); *H01L 27/0207* (2013.01); *H01L 2924/0002* (2013.01)

(56) References Cited

U.S. PATENT DOCUMENTS

| | | | | |
|---|---|---|---|---|
| 2003/0104674 | A1* | 6/2003 | Kasai | 438/396 |
| 2009/0134432 | A1* | 5/2009 | Tabata et al. | 257/211 |
| 2009/0230449 | A1* | 9/2009 | Sakaguchi et al. | 257/298 |
| 2009/0230450 | A1* | 9/2009 | Shiino et al. | 257/314 |
| 2009/0261386 | A1* | 10/2009 | Makino | 257/210 |
| 2009/0267047 | A1* | 10/2009 | Sasago et al. | 257/4 |
| 2009/0267128 | A1 | 10/2009 | Maejima | |
| 2009/0267135 | A1* | 10/2009 | Tanaka et al. | 257/324 |
| 2009/0267139 | A1* | 10/2009 | Maejima | 257/326 |
| 2010/0032725 | A1* | 2/2010 | Baba et al. | 257/211 |
| 2010/0038616 | A1* | 2/2010 | Nagashima et al. | 257/2 |
| 2010/0090188 | A1* | 4/2010 | Futatsuyama | 257/2 |
| 2010/0091550 | A1* | 4/2010 | Chen et al. | 365/148 |
| 2010/0109071 | A1* | 5/2010 | Tanaka et al. | 257/324 |
| 2010/0187591 | A1* | 7/2010 | Nagashima | 257/314 |
| 2010/0237512 | A1* | 9/2010 | Okukawa et al. | 257/786 |
| 2010/0254191 | A1 | 10/2010 | Son et al. | |
| 2011/0026303 | A1* | 2/2011 | Choi et al. | 365/148 |
| 2011/0049465 | A1* | 3/2011 | Nagashima | 257/5 |
| 2011/0069531 | A1* | 3/2011 | Aburada et al. | 365/148 |
| 2011/0095438 | A1 | 4/2011 | Scheuerlein et al. | |
| 2011/0164444 | A1* | 7/2011 | Fukano | 365/51 |
| 2012/0025386 | A1* | 2/2012 | Murata | 257/770 |
| 2012/0049148 | A1* | 3/2012 | Fukano | 257/5 |
| 2012/0051122 | A1* | 3/2012 | Tsuji et al. | 365/158 |
| 2012/0069638 | A1* | 3/2012 | Matsuda et al. | 365/158 |
| 2012/0147687 | A1* | 6/2012 | Douzaka | 365/208 |
| 2012/0299063 | A1* | 11/2012 | Baba | 257/208 |

FOREIGN PATENT DOCUMENTS

| | | |
|---|---|---|
| JP | 2006-140185 | 6/2006 |
| JP | 2006-156998 | 6/2006 |
| JP | 2009-266945 | 11/2009 |
| JP | 2011-54758 | 3/2011 |

OTHER PUBLICATIONS

Japanese Office Action issued May 13, 2014 in Patent Application No. 2012-065789 with English Translation.
Office Action issued in Taiwanese Patent Application No. 102106468, (with English-language Translation).

* cited by examiner

MIM STRUCTURE

DIODE STRUCTURE
(PIN Diode)

SEMICONDUCTOR MEMORY DEVICE

CROSS REFERENCE TO RELATED APPLICATIONS

This application is based on and claims the benefit of priority from prior Japanese Patent Application No. 2012-65789, filed on Mar. 22, 2012, the entire contents of which are incorporated herein by reference.

FIELD

The embodiments described in the specification relate to a semiconductor memory device.

BACKGROUND

As the degree of integration of a semiconductor device has recently been increased, the circuit pattern of the transistors or the like included in the semiconductor device increasingly becomes finer. The finer pattern requests not only a reduced line width, but improved dimensional and positioning accuracies of the pattern. This also holds true for the semiconductor memory devices.

Each of the semiconductor memory devices that have been conventionally known and introduced into the market, such as DRAM, SRAM, and a flash memory, uses a MOSFET in the memory cell. Thus, as the pattern becomes finer, the dimensional accuracy is requested to be improved at a ratio higher than that required in fining the pattern. The lithography technology that forms the patterns thus undergoes a large load, which is a factor of increasing the product cost.

As a successor to the semiconductor memory device using the MOSFET as the memory cell, a resistance random access memory has recently drawn attention. In the resistance random access memory, a cross point type cell structure can be adopted. The cross point type cell structure has memory cells formed in intersections of crossing bit-lines and word-lines. The memory cells can thus be made compact more easily than the conventional memory cells, and be stacked in the vertical direction, thereby providing an advantage in that the degree of integration of the memory cell array can be readily improved.

In the semiconductor memory device of the cross point type cell structure, many contacts are formed. The contacts extend in a direction perpendicular to a semiconductor substrate to connect the memory cell array with the peripheral circuits. The contact formation has raised a problem where an open failure is generated at the contact due to some reasons such as poor deposition characteristics of an interlayer dielectric film or insufficient optimization of the interlayer dielectric film in the high densification process or the thermal process. Therefore, there is a need for a structure to suppress the generation of the open failure.

DETAILED DESCRIPTION

A semiconductor memory device according to the embodiments described below comprises a plurality of first wiring lines extending in a first direction, a plurality of second wiring lines extending in a second direction crossing the first direction, and a memory cell array comprising memory cells, the memory cells being connected to the first wiring lines and second wiring lines in the crossing portions of the first and second wiring lines.

A plurality of first dummy-wiring-line regions are formed in the peripheral area around the memory cell array. Each first dummy-wiring-line region comprises a first dummy wiring line and a second dummy wiring line, the first and second dummy wiring lines being formed in the same layer as the first and second wiring lines.

Further, a contact is formed in the peripheral area, the contact extending in a third direction perpendicular to the first and second directions. A plurality of second dummy-wiring-line regions are formed in the periphery of the contact. Each second dummy-wiring-line region comprises a third dummy wiring line and a fourth dummy wiring line, the third and fourth dummy wiring lines being formed in the same layer as the first and second wiring lines. The mean value of the areas of the second dummy-wiring-line regions is less than the mean value of the areas of the first dummy-wiring-line regions.

Referring now to drawings, embodiments of the invention will be described below.

Figure 1:
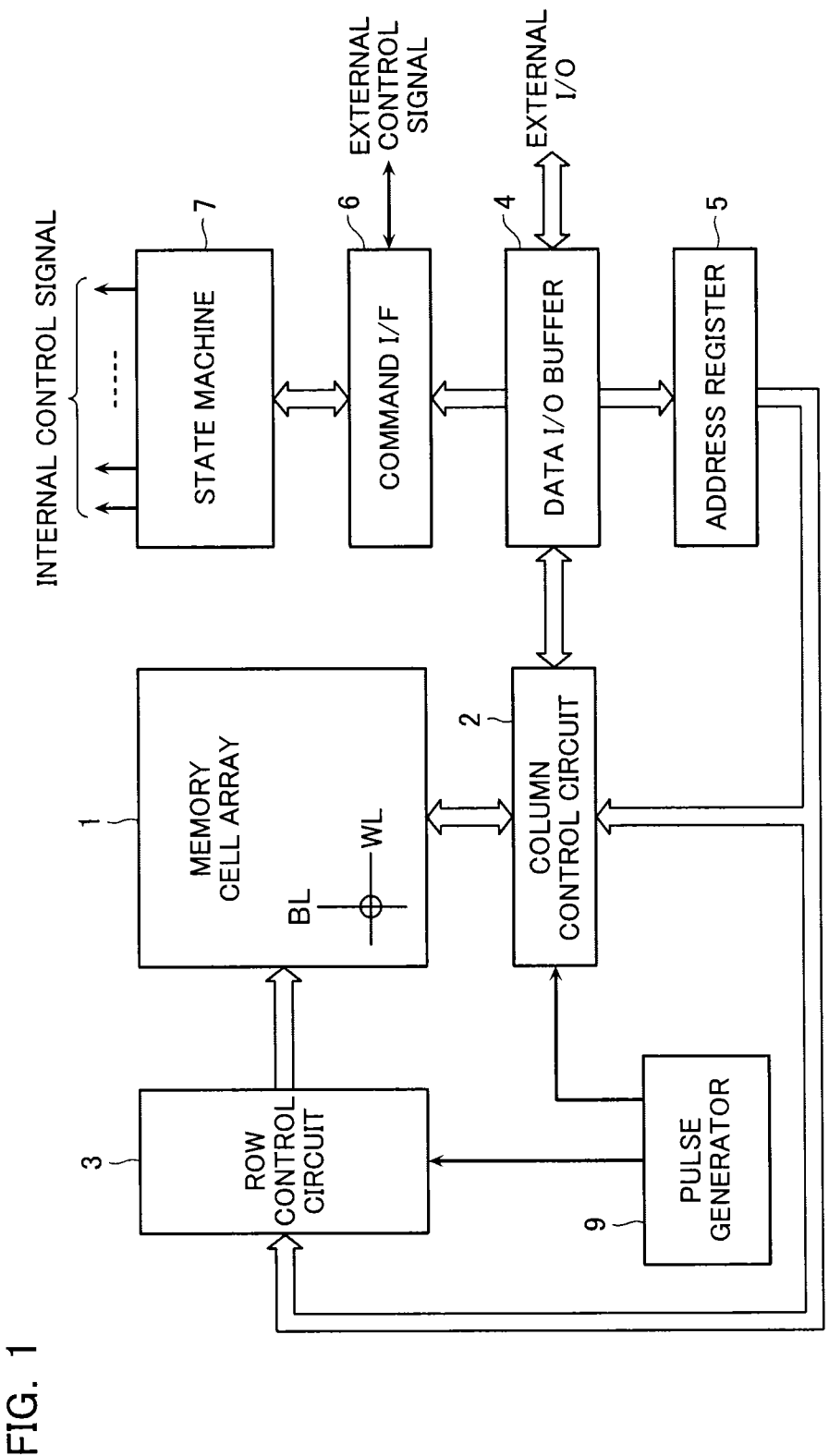
FIG. 1 is a block diagram of a semiconductor memory device (non-volatile memory) according to an embodiment.

First, referring to FIG. 1 to FIG. 4, a schematic configuration of a semiconductor memory device according to an embodiment will be described. FIG. 1 is a block diagram of the semiconductor memory device (non-volatile memory) according to the embodiment.

With reference to FIG. 1, the semiconductor memory device according to the embodiment comprises a memory cell array 1, the memory cell array 1 comprising a plurality of memory cells arranged in a matrix, each memory cell using a ReRAM (variable resistance element) described below. In a position adjacent to the memory cell array 1 in a bit-line BL direction, a column control circuit 2 is provided. The column control circuit 2 controls bit-lines BL of the memory cell array 1 to perform data erase of the memory cells, data write to the memory cells, and data read from the memory cells.

Further, in a position adjacent to the memory cell array 1 in a word-line WL direction, a row control circuit 3 is provided. The row control circuit 3 selects a word-line WL of the memory cell array 1 and applies voltages necessary for the data erase of the memory cells, the data write to the memory cells, and the data read from the memory cells.

A data input/output buffer 4 is connected to a not-shown external host via an I/O line. The data input/output buffer 4 receives write data, receives an erase instruction, outputs read data, and receives address data and command data. The data input/output buffer 4 sends received write data to the column control circuit 2. The data input/output buffer 4 also receives data read from the column control circuit 2 and outputs it externally. The address externally supplied to the data input/output buffer 4 is sent to the column control circuit 2 and the row control circuit 3 via an address register 5. Further, the command supplied from the host to the data input/output buffer 4 is sent to a command interface 6.

The command interface 6 receives an external control signal from the host, and determines whether data input to the data input/output buffer 4 is write data, a command, or an address. If the data is a command, the command interface 6 receives it and transfers it to a state machine 7 as a command signal. The state machine 7 manages the entire memory. The state machine 7 receives a command from the host for managing processes such as read, write, erase, and input/output of data. Further, the external host may receive status information managed by the state machine 7 and determine the operation result. The status information is also used for controlling write and erase.

Further, the state machine 7 controls a pulse generator 9. This control allows the pulse generator 9 to output a pulse of any voltage at any timing. Here, the formed pulse may be transferred to any wiring line selected by the column control circuit 2 and the row control circuit 3.

Note that the peripheral circuit devices other than the memory cell array 1 may be formed immediately below the memory array 1 formed in the wiring layer, or formed on a semiconductor substrate in the peripheral area around the memory array 1.

Figure 2A:
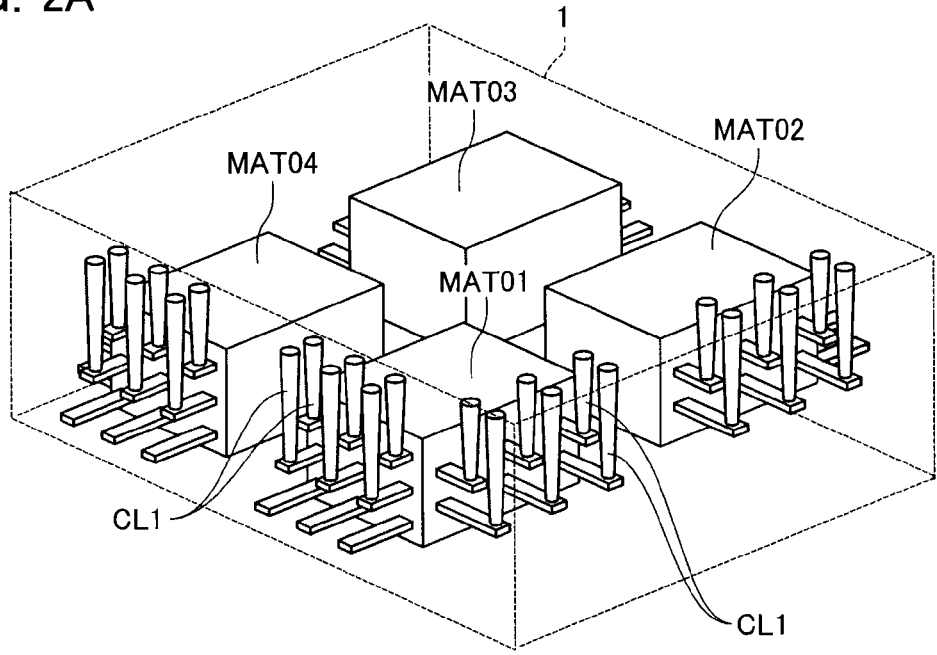
FIG. 2A is a perspective view of memory cell arrays (unit memory cell arrays MAT00 to MAT04) of a semiconductor memory device according to an embodiment.
Figure 2B:
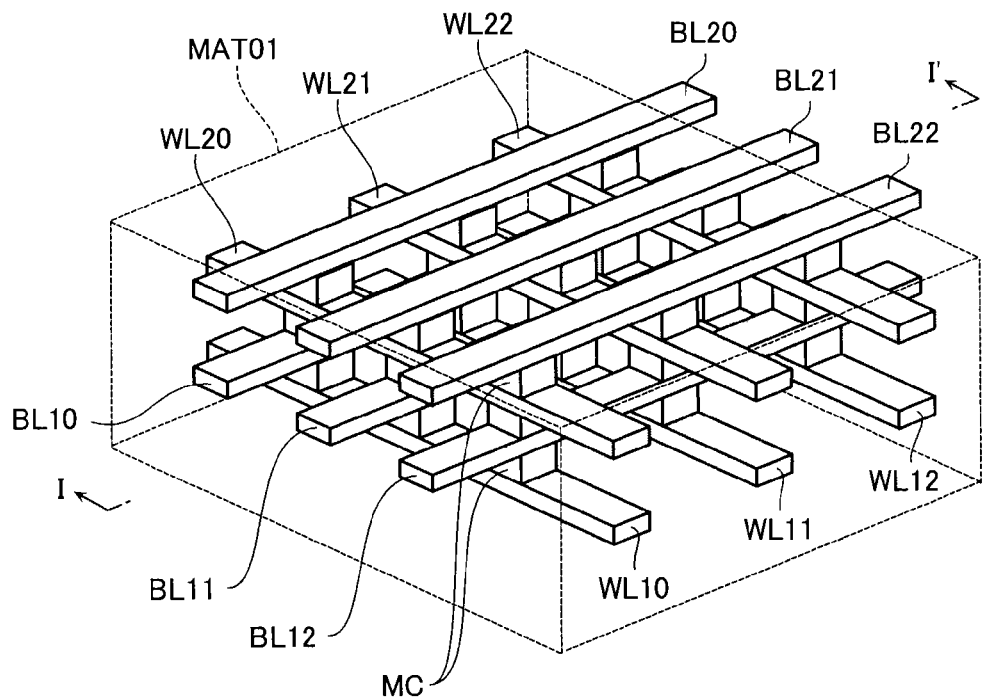
FIG. 2B is a partially enlarged perspective view of the memory cell array 1 in FIG. 2A.
Figure 3A:
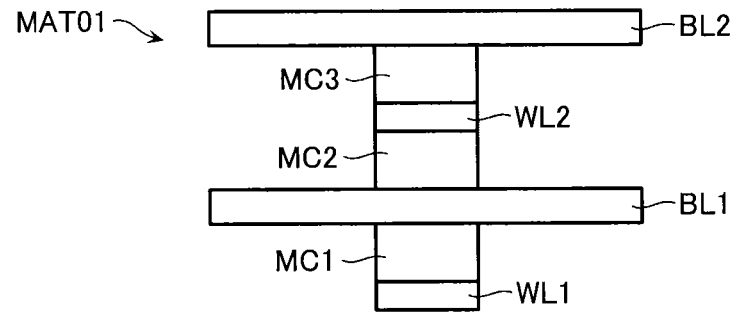
FIG. 3A is a cross-sectional view along line I-I' in FIG. 2B.

FIG. 2A is a perspective view of the memory cell array 1. FIG. 2B is a partially enlarged perspective view of the memory cell array 1. FIG. 3A is a cross-sectional view of one memory cell cut along line I-I' in FIG. 2B when viewed in the arrow direction.

With reference to FIG. 2A, byway of example, the memory cell array 1 is divided into four unit cell arrays MAT01 to MAT04. Each of the unit cell arrays MAT01 to MAT04 has a portion of the memory cell array 1. With reference to FIG. 2A, the unit cell arrays MAT01 to MAT04 are two-dimensionally disposed. Note that FIG. 2A shows merely an example and the memory cell array 1 may be configured to have four or more unit cell arrays. The memory cell array 1 may also be configured to have unit cell arrays stacked three-dimensionally.

With reference to FIG. 2B, the unit cell array MAT0' comprises, from the lower layer to the upper layer, multi layers of a word-line WL1$i$, a bit-line BL1$i$, a word-line WL2$i$, and a bit-line BL2$i$ (i=0 to 2) . . . . Then, memory cells MC are formed in the positions between the bit-lines BL and the word-lines WL in the vertical direction. The memory cells MC are formed in a matrix over a plurality of layers. For ease of illustration, FIG. 2B only shows two-layer word-lines WL and two-layer bit-lines BL.

The bit-lines BL are formed extending in the same direction (column direction). The word-lines WL are formed extending in a direction (the row direction) perpendicular to (crossing) the bit-lines BL.

With reference to FIG. 3A, memory cells MC1 to MC3 are formed in the crossing portions of the word-lines WL and the bit-lines BL. The bit-line BL1$i$ is shared by the memory cells MC1 and MC2 below and above it. The word-line WL2$i$ is shared by the memory cells MC2 and MC3 below and above it. In this way, the memory cells MC, the bit-lines BL, and the word-lines WL are stacked in multi layers in a way that the bit-lines BL and the word-lines WL are shared by the upper and lower memory cells MC.

Figure 3B:
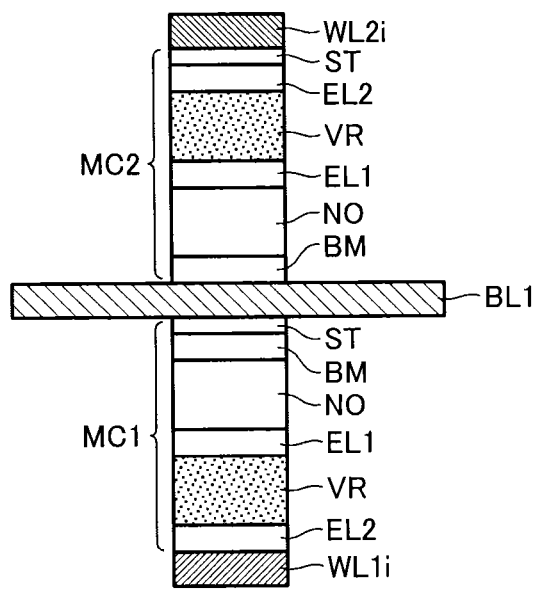
FIG. 3B is a cross-sectional view of the memory cells MC1 and MC2.

With reference to FIG. 3B, each memory cell MC comprises a circuit comprising a variable resistance element VR and a non-ohmic device NO connected in series. FIG. 3B shows the memory cells MC1 and MC2.

With reference to FIG. 3B, each memory cell MC1 and MC2 comprise, in sequence in the direction from the upper layer to the lower layer, a stopper film ST, a barrier metal BM, a non-ohmic device NO, an electrode EL1, a variable resistance element VR, and an electrode EL2.

The variable resistance element VR is a device that may change, when applied with a voltage, its resistance via current, heat, chemical energy, or the like. The variable resistance element VR has electrodes EL1 and EL2 disposed below and above it, the electrodes EL1 and EL2 functioning as a barrier metal and a bonding layer. The electrode material comprises Pt, Au, Ag, TiAlN, SrRuO, Ru, RuN, Ir, Co, Ti, TiN, TaN, LaNiO, Al, PtIrOx, PtRhOx, and/or Rh/TaAlN.

Further, a metal film may be inserted for uniform orientation. Further, other layers such as a buffer layer, a barrier metal layer, and a bonding layer may separately be inserted.

The variable resistance element VR may comprise the following elements: an element such as chalcogenide that may change the resistance via a phase transition between a crystalline state and a noncrystalline state (PCRAM); an element that may change the resistance by forming cross-links (contacting bridges) between electrodes via metal cation precipitation or by breaking the cross-links by ionizing precipitated metal (CBRAM); and an element that may change the resistance by an applied voltage or current (ReRAM) (that is broadly classified into two types, one changing the resistance by the presence or absence of charge trapped in a charge trap at an electrode interface, and the other one changing the resistance by the presence or absence of a conductive path due to oxygen defect or the like).

Preferably, the bit-lines BL0$i$ to BL2$i$ and the word-lines WL0$i$ and WL1$i$ comprise materials that are thermally resistant and have low resistance, such as W, WSi, NiSi, and CoSi.

Figure 4:
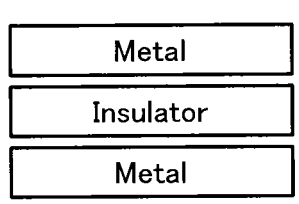
FIG. 4 illustrates a specific example of a non-ohmic device NO according to an embodiment.
Figure 4:
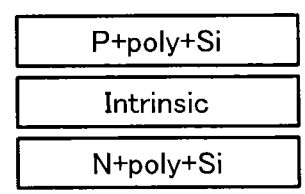

The non-ohmic device NO has structured such as, for example, (a) an MIM (Metal-Insulator-Metal) structure and (b) a PIN structure (P+poly-Silicon-Intrinsic-N+poly-Silicon), as shown in FIG. 4. Again, the electrodes EL2 and EL3 forming the barrier metal layer and the bonding layer may be inserted. Further, the MIM structure may perform the bipolar operation. Further, the PIN structure (diode structure) may perform the unipolar operation by its characteristics.

The stopper film ST comprises tungsten (W). The electrodes EL1 and EL2 and the barrier metal BM comprise titanium (Ti)/titanium nitride (TiN).

Figure 5:
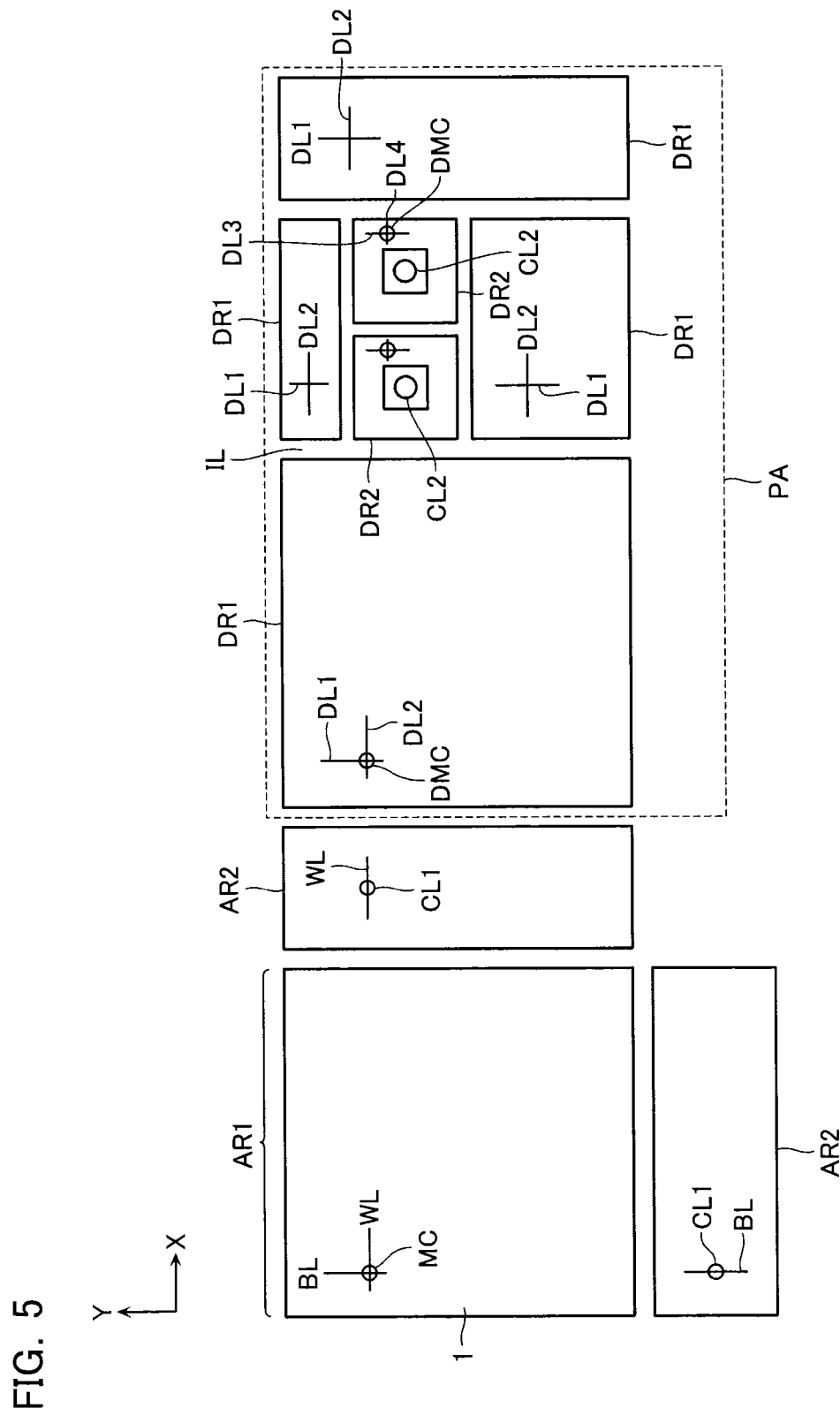
FIG. 5 illustrates an example layout of a memory region AR1 having the memory cell array 1 formed therein, a wiring line region AR2, and a peripheral area PA.

FIG. 5 shows an example layout of a memory region AR1 in which the memory cell array 1 is formed, a wiring line region AR2, and a peripheral area PA in which the peripheral circuits are formed, including the above column control circuit 2 and the row control circuit 3 or the like.

On the surface of the semiconductor substrate in the peripheral area PA, transistors are formed that are included in the above peripheral circuits (including the column control circuit 2 and the row control circuit 3). Then, above the semiconductor substrate in the peripheral area PA, a first dummy-wiring-line region DR1, a second dummy-wiring-line region DR2, and a contact CL2 are formed. The contact CL2 is formed in a direction perpendicular to the semiconductor substrate, i.e., in a direction perpendicular to the above row direction and column direction. Note that in the spaces between the first dummy-wiring-line region DR1, the second dummy-wiring-line region DR2, and the contact CL2, an interlayer dielectric film IL comprising a material such as silicon oxide film is embedded.

The first dummy-wiring-line region DR1 comprises a first dummy wiring line DL1, a second dummy wiring line DL2, and a dummy cell DMC formed in the intersection between them. The first dummy wiring line DL1 is formed in the same layer as the bit-lines BL, and is formed extending in the Y-direction like the bit-lines BL. Further, the second dummy wiring line DL2 is formed in the same layer as the word-line WL, and is formed extending in the X-direction like the word-lines WL. The first dummy wiring line DL1 and the second dummy wiring line DL2 are unconnected to other wiring lines or contacts, and thus they do not function as the wiring lines. Therefore, the dummy cells DMC sandwiched between the dummy wiring lines do not function as the memory cells MC, although they have the same structures as the memory cells.

Similarly, the second dummy-wiring-line region DR2 comprises a third dummy wiring line DL3, a fourth dummy wiring line DL4, and a dummy cell DMC formed in the intersection between them. The third dummy wiring line DL3 is formed in the same layer as the bit-lines BL, and is formed extending in the Y-direction like the bit-lines BL. Further, the fourth dummy wiring line DL4 is formed in the same layer as the word-lines WL, and is formed extending in the X-direction like the word-lines WL. The third dummy wiring line DL3 and the fourth dummy wiring line DL4 are unconnected to other wiring lines, and thus they do not function as the wiring lines. Therefore, the dummy cells DMC sandwiched between the dummy wiring lines do not function as the memory cells MC, although they have the same structures as the memory cells.

The first dummy-wiring-line region DR1 is formed to suppress dishing (a depression in the interlayer dielectric film) in the peripheral area PA when the CMP (chemical mechanical polishing) is performed. Further, the second dummy-wiring-line region DR2 is formed surrounding the contact CL2 around the contact CL2. The second dummy-wiring-line region DR2 is formed to reduce the generation of an open failure at the contact CL2. Due to the above arrangements and roles, the second dummy-wiring-line region DR2 has a lower mean area than the first dummy-wiring-line region DR1.

The second dummy-wiring-line region DR2 may have, by itself, a plane shape surrounding one or more contacts CL2. Further, a plurality of independent second dummy-wiring-line regions DR2 may have a plane shape surrounding one or more contacts CL2. By way of example, with reference to FIG. 5, the second dummy-wiring-line region DR2 may have a rectangular shape surrounding one contact CL2 and having an opening at its center portion.

Figure 6:
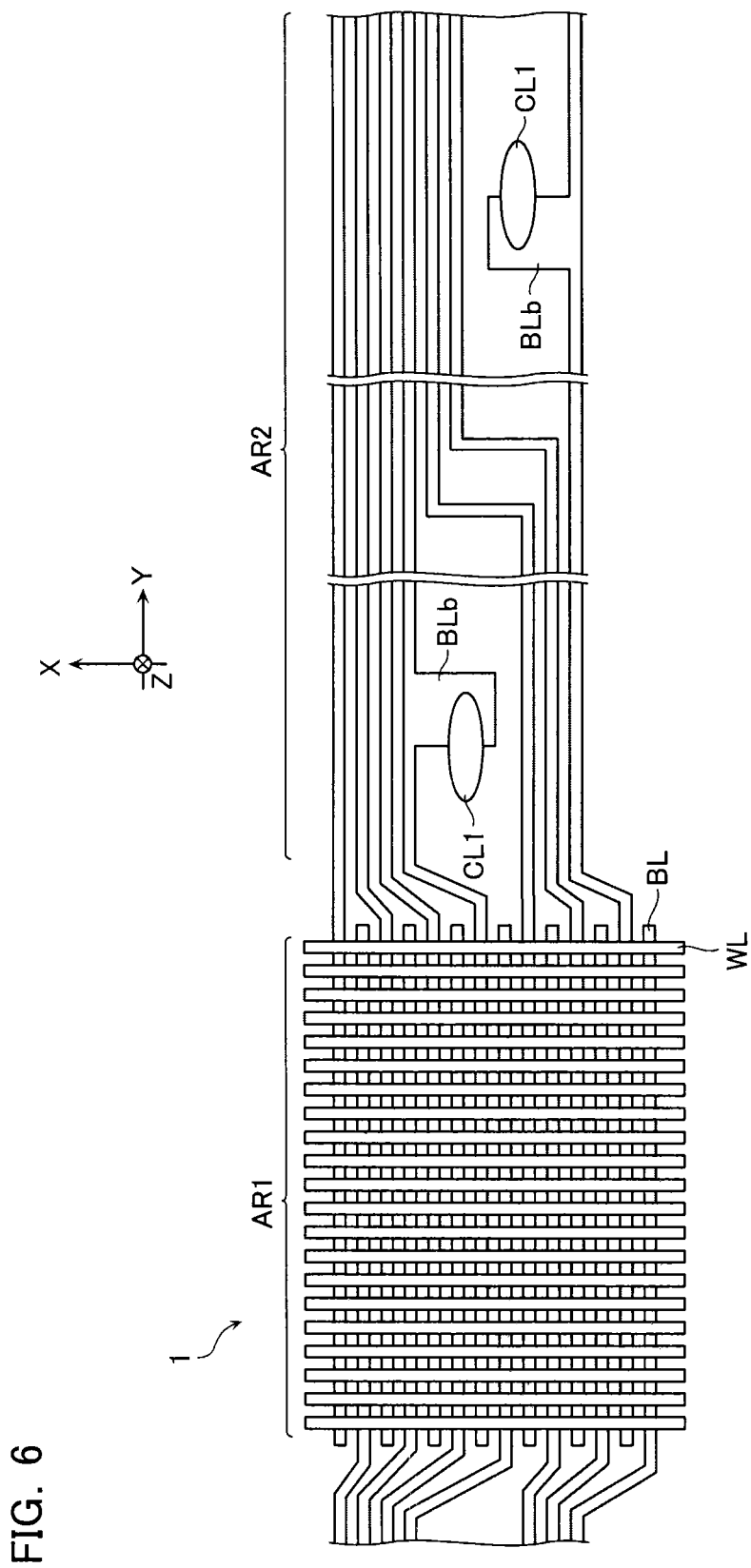
FIG. 6 is a plan view of the memory region AR1 and the wiring line region AR2.

FIG. 6 is a plan view of the memory region AR1 in which the memory cell array 1 is formed and the wiring line region AR2 routing the bit-lines BL and the word-lines WL, the bit-lines BL and word-lines WL extending from the memory region AR1. FIG. 6 particularly shows only a layout of the bit-lines BL in the wiring line region AR2. Although not shown in FIG. 5, the word-lines WL are also extending in the X-direction in FIG. 5.

With reference to FIG. 6, the odd-numbered bit-lines BL are drawn from one side of the memory cell array 1 to the wiring line region AR2 and are extending in the Y-direction in FIG. 6. Although not shown, the even-numbered bit-lines BL are drawn from the opposite side of the memory cell array 1 to the wiring line region AR2, and are also extending in the Y-direction in FIG. 6.

The bit-line BL1 comprises a hook portion BLb formed in a portion of its side, the hook portion BLb projecting in the X-direction. The hook portion BLb is provided to be in contact with a contact CL1 extending in the stacking direction (Z-direction). Although FIG. 6 only shows the hook portions BLb of two bit-lines BL, the other bit-lines BL also have similar hook portions BLb. Further, although not shown in FIG. 6, each word-line WL also has a hook portion WLb formed in a portion of its side, the hook portion WLb projecting in the Y-direction.

Figure 7:
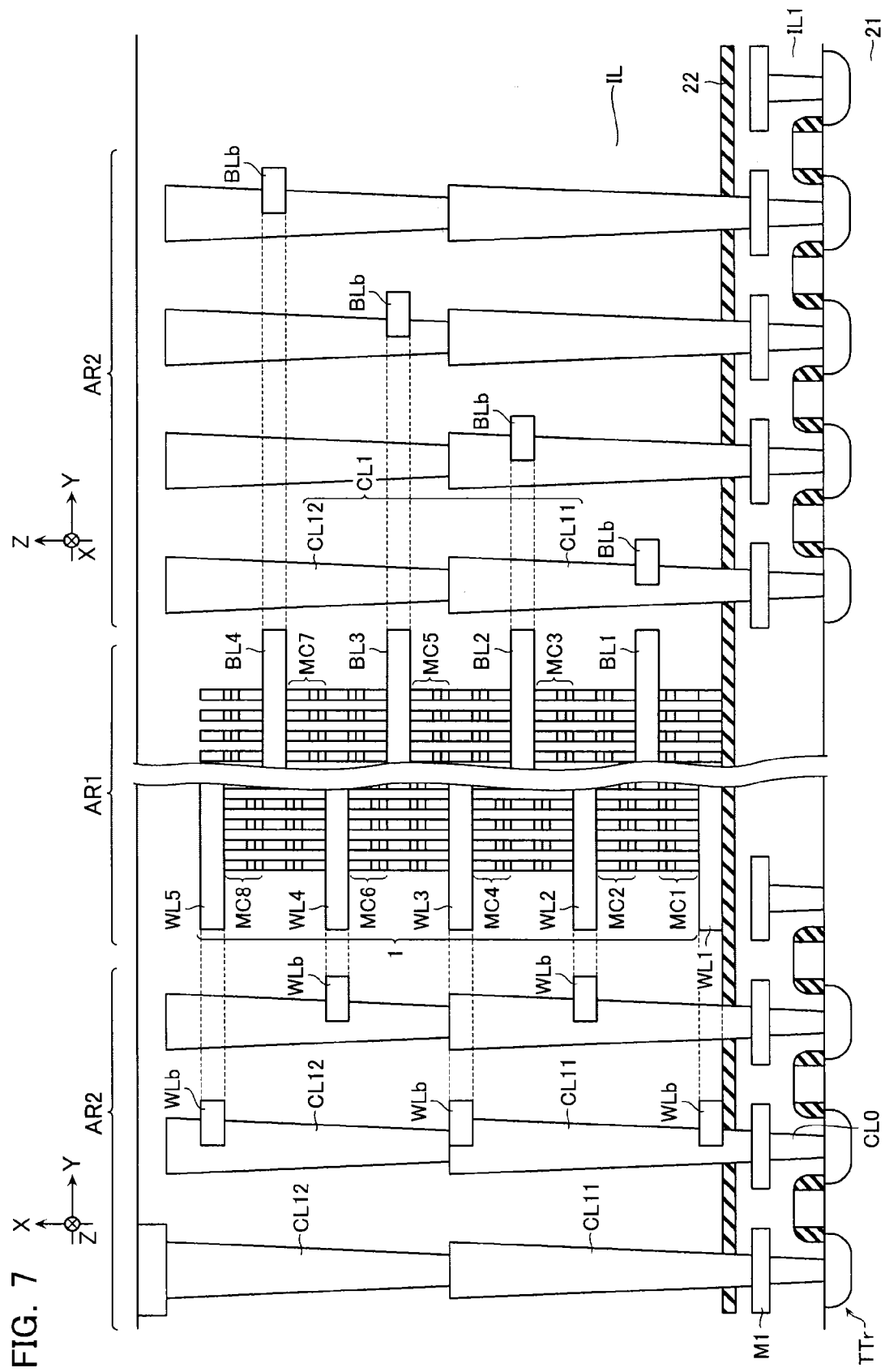
FIG. 7 is a schematic diagram showing cross-section structures of the memory cell array 1 (memory region AR1) and the wiring line region AR2.

FIG. 7 is a schematic cross-sectional view of the memory cell memory region AR1 and the wiring line region AR2 in FIG. 6. FIG. 7 shows, in its center, a cross-sectional view of the memory region AR1. FIG. 7 shows, on its right side, a cross-section (a cross-section in the Y axial direction) of the wiring line region AR2 in which the bit-lines BL are formed. Further, FIG. 7 shows, on its left side, a cross-section (a cross-section in the X axial direction) of the wiring line region AR2 in which the word-lines WL are formed. Note that FIG. 7 shows an example where the five word-lines WL1 to WL5 and the four bit-lines BL1 to BL4 are formed and eight layers of the memory cell array (MC1 to MC8) are formed between the word-lines WL and the bit-lines BL.

With reference to FIG. 7, the memory cell array 1 is formed on a silicon nitride film 22, the silicon nitride film being formed on a semiconductor substrate 21 via an interlayer dielectric film IL. The semiconductor substrate 21 bears transfer transistors TTr included in the column control circuit 2 and the row control circuit 3, and high breakdown voltage transistors included in other circuits. Note that the silicon nitride film 22 may be omitted and the memory cell array 1 may be formed directly on the interlayer dielectric film IL.

With reference to the right side in FIG. 7, the bit-lines BL are formed extending in the Y axis direction, and comprise hook portions BLb projecting in the X-direction. Each hook portion BLb is connected to a contact CL11 or CL12. In this embodiment, the contacts CL11 and CL12 are stacked in the stacking direction, forming one contact CL1 (a continuous contact structure). Further, with reference to the left side in FIG. 7, the word-lines WL are formed extending in the X axis direction, and comprise hook portions WLb projecting in the Y-direction. Each hook portion WLb is connected to the contact CL11 or CL12. The contact CL1 passes through the silicon nitride film 22 and connects to the underlying M1 metal wiring line. The M1 metal wiring line has a contact CL0 formed under it. The contact CL0 is connected to one of the above transistors TTr.

Figure 8:
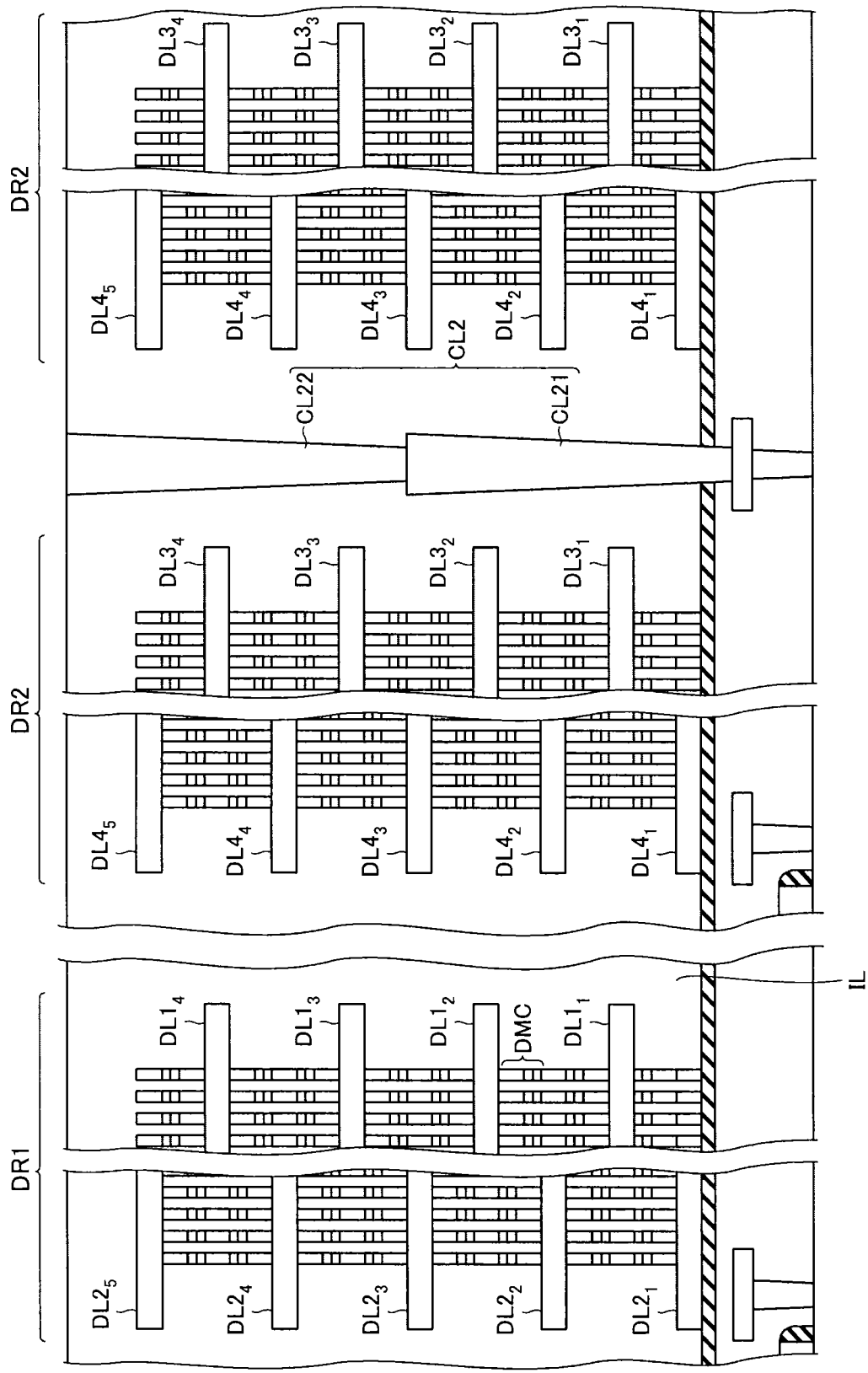
FIG. 8 is a schematic diagram showing cross-section structures of a first dummy-wiring-line region DR1, a second dummy-wiring-line region DR2, and a contact CL2.

Referring now to FIG. 8, specific example configurations of the first dummy-wiring-line region DR1 and the second dummy-wiring-line region DR2 will be described. As described above, the first dummy-wiring-line region DR1 comprises the first dummy wiring lines DL1 ($DL1_1$ to $DL1_4$), the second dummy wiring lines DL2 ($DL2_1$ to $DL2_5$), and the dummy cells DMC formed in the intersections thereof. The first dummy wiring lines $DL1_1$ to $DL1_4$ are formed in the same layer as the bit-lines BL1 to BL4. Further, the second dummy wiring lines DL2$_1$ to DL2$_5$ are formed in the same layer as the word-lines WL.

Similarly, the second dummy-wiring-line region DR2 comprises the third dummy wiring lines DL3 (DL3$_1$ to DL3$_4$), the fourth dummy wiring lines DL4 (DL4$_1$ to DL4$_5$), and the dummy cells DMC formed in the intersections thereof. The third dummy wiring lines DL3$_1$ to DL3$_4$ are formed in the same layer as the bit-lines BL1 to BL4. Further, the fourth dummy wiring lines DL4$_1$ to DL4$_5$ are formed in the same layer as the word-lines WL.

Figure 9:
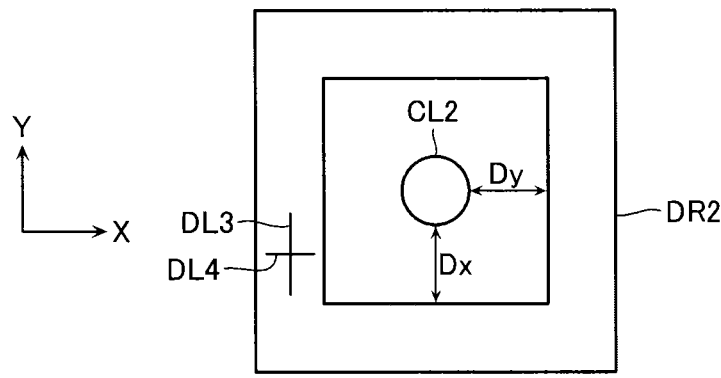
FIG. 9 illustrates an example configuration of the second dummy-wiring-line region DR2.

FIG. 9 shows a first example of a plane shape of the second dummy-wiring-line region DR2. FIG. 9 shows an example where one second dummy-wiring-line region DR2 has a closed-loop rectangular shape surrounding the periphery of one contact CL2 formed in the peripheral area PA. One contact CL2 is formed at a generally center of the closed loop of each second dummy-wiring-line region DR2. Specifically, the contact CL2 is formed in the second dummy-wiring-line region DR2 so that the distance Dx in the X-direction and the distance Dy in the Y-direction are generally the same in FIG. 9. Adopting such an arrangement may cancel the affect of the stress from the peripheral interlayer dielectric film when producing contacts, thus suppressing the generation of the open failure.

Figure 10:
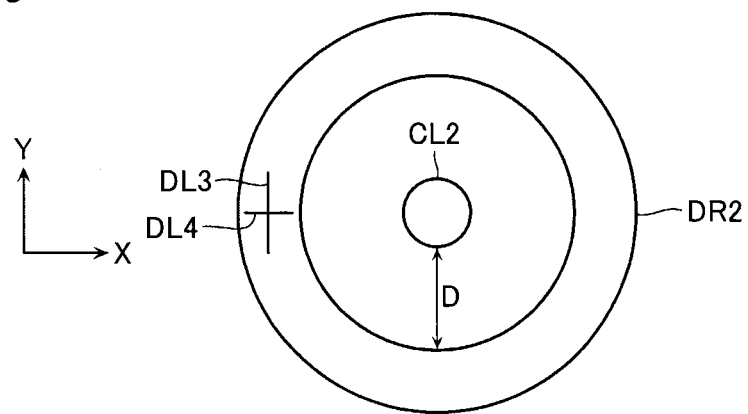
FIG. 10 illustrates an example configuration of the second dummy-wiring-line region DR2.

FIG. 10 shows a second example of a plane shape of the second dummy-wiring-line region DR2. The second example in FIG. 10 is the same as the first example in that one second dummy-wiring-line region DR2 has a closed loop rectangular shape surrounding the periphery of one contact CL2 formed in the peripheral area PA. Note, however, that in FIG. 10, the second dummy-wiring-line region DR2 has an annular shape instead of a rectangular shape. In this case, the contact CL2 may have the same distance to the second dummy-wiring-line region DR2 in the X-direction and Y-direction as well as in all directions of 360°.

Figure 11:
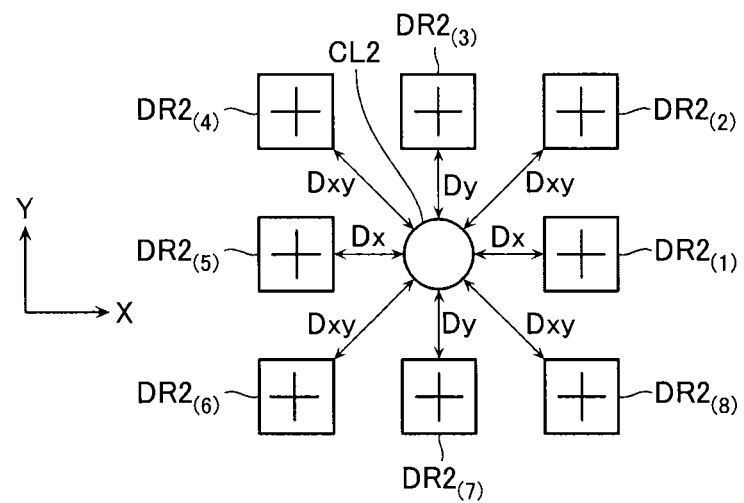
FIG. 11 illustrates an example configuration of the second dummy-wiring-line region DR2.

FIG. 11 shows a third example of a plane shape of the second dummy-wiring-line region DR2. The third example in FIG. 11 is different from the first and second examples in that multiple (eight in FIG. 11) second dummy-wiring-line regions DR2$_{(1)}$ to DR2$_{(8)}$ surround one contact CL2. In FIG. 11, eight second dummy-wiring-line regions DR2$_{(1)}$ to DR2$_{(8)}$ are arranged in a rectangular shape. The contact CL2 is disposed around the center of the rectangular portion so that the distances Dx and Dy are generally the same in FIG. 11.

Figure 12:
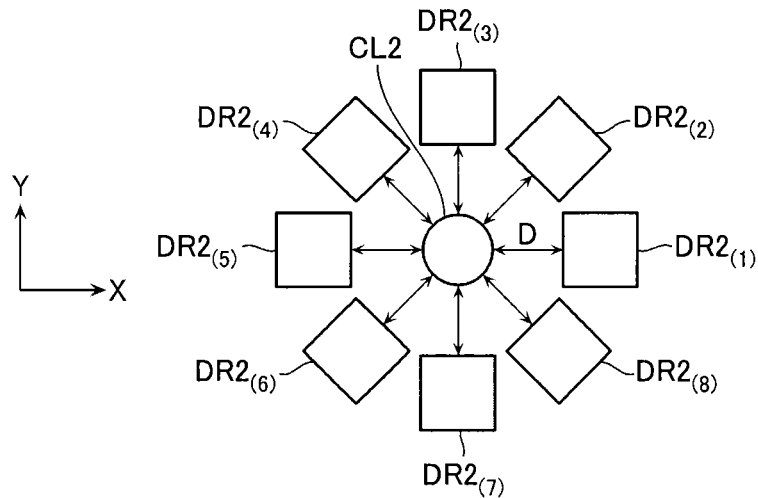
FIG. 12 illustrates an example configuration of the second dummy-wiring-line region DR2.

FIG. 12 shows a fourth example of a plane shape of the second dummy-wiring-line region DR2. The fourth example in FIG. 12 is common with the third example in that multiple (eight in FIG. 11) second dummy-wiring-line regions DR2$_{(1)}$ to DR2$_{(8)}$ surround one contact CL2. Note, however, that in FIG. 12, eight second dummy-wiring-line regions DR2$_{(1)}$ to DR2$_{(8)}$ are arranged in an annular shape. In FIG. 11, the distances Dxy to the second dummy-wiring-line regions DR2$_{(2)}$, DR2$_{(4)}$, DR2$_{(6)}$, and DR2$_{(8)}$ at the vertices of the rectangular portion are slightly larger than the distances Dx and Dy. In FIG. 12, however, the distances from the contact CL2 to the eight second dummy-wiring-line regions DR2$_{(1)}$ to DR2$_{(8)}$ are all the same. In this regard, the probability of the open failure generation at the contact CL2 is further suppressed relative to the example in FIG. 11. This is because the stress applied to the contacts is uniform in any direction as the distances are all the same not only in the four directions (left, right, upper, and lower) but also in the eight directions including the four directions.

Figure 13:
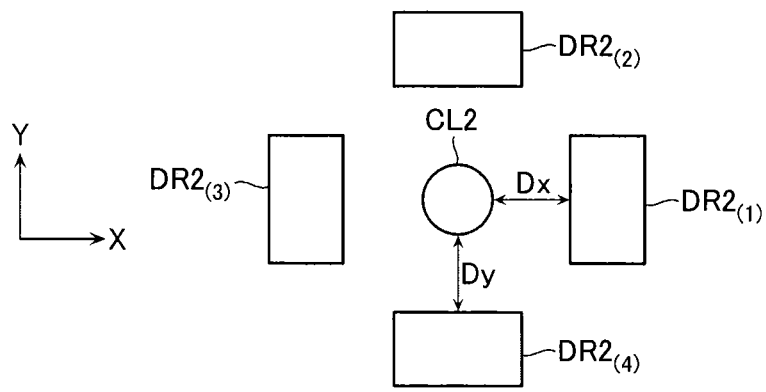
FIG. 13 illustrates an example configuration of the second dummy-wiring-line region DR2.
Figure 14:
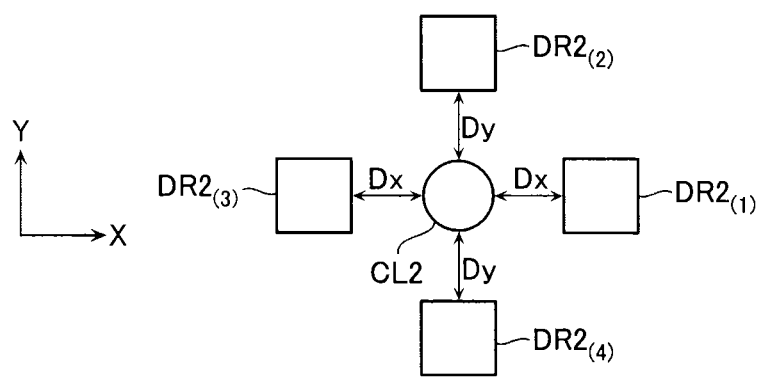
FIG. 14 illustrates an example configuration of the second dummy-wiring-line region DR2.

FIG. 13 shows a fifth example of a plane shape of the second dummy-wiring-line region DR2. In the fifth example in FIG. 13, the second dummy-wiring-line regions DR2$_{(1)}$ to DR2$_{(4)}$ having four rectangles surround one contact CL2. Four second dummy-wiring-line regions DR2$_{(1)}$ to DR2$_{(4)}$ are disposed in the directions of 0°, 90°, 180°, and 270° when viewed from the contact CL2. The contact CL2 is disposed so that the distance Dx from the contact CL2 to the second dummy-wiring-line region DR2$_{(1)}$ or DR2$_{(3)}$ is generally the same as the distance Dy from the contact CL2 to the second dummy-wiring-line region DR2$_{(2)}$ or DR2$_{(4)}$. This may exert an effect similar to that in the first example. FIG. 14 shows a sixth example that is a modified example of the fifth example and where the second dummy-wiring-line regions DR2$_{(1)}$ to DR2$_{(4)}$ have a square shape.

Figure 15:
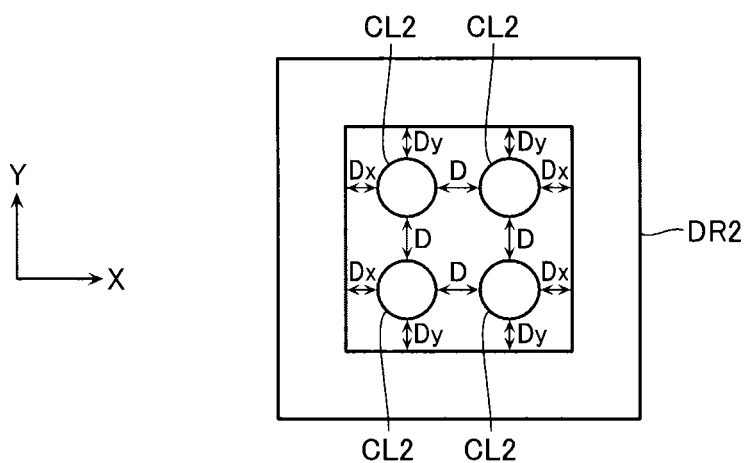
FIG. 15 illustrates an example configuration of the second dummy-wiring-line region DR2.

FIG. 15 shows a seventh example of a plane shape of the second dummy-wiring-line region DR2. The seventh example in FIG. 15 shows a configuration in which one second dummy-wiring-line region DR2 of a rectangular shape surrounds multiple (four in FIG. 15) contacts CL2. The contacts CL2 are disposed so that the distances Dx and Dy from one contact CL2 to the second dummy-wiring-line region DR2 in the X-direction and Y-direction are generally the same for all four contacts CL2. The contacts CL2 are also disposed so that all distances D between the four contacts CL2 are generally the same. It is thus expected that an effect may be exerted similar to that in the above examples.

Thus, various examples of the configuration of the second dummy-wiring-line region DR2 have been described. In each example, the mean value of the areas of the multiple second dummy-wiring-line regions DR2 is less than the mean value of the areas of the multiple first dummy-wiring-line regions DR1. Then, such a single or multiple second dummy-wiring-line regions DR2 are formed surrounding one or multiple contacts CL2. The distance condition from one contact CL2 to the second dummy-wiring-line region DR2 is set to be generally the same for the multiple contacts. This may reduce the possibility of the open failure generation at the contact CL2, thus improving the reliability. Note that one semiconductor memory device may comprise a combination of some of the above seven example structures or comprise only one example structure. For example, the example structure in FIG. 9 may be adopted for at least one contact CL2, and different example structures may be adopted for other contacts CL2.

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fail within the scope and spirit of the inventions.

What is claimed is:

1. A semiconductor memory device comprising:
    a plurality of first wiring lines extending in a first direction;
    a plurality of second wiring lines extending in a second direction crossing the first direction;
    a memory cell array comprising memory cells, the memory cells being connected to the first wiring lines and second wiring lines in crossing portions of the first and second wiring lines;
    a first dummy-wiring-line region formed in a peripheral area around the memory cell array, the first dummy-wiring-line region comprising a first dummy wiring line and a second dummy wiring line, the first dummy wiring line being formed in the same layer as the first wiring lines and disconnected from the first wiring lines, and the second dummy wiring line being formed in the same layer as the second wiring lines and disconnected from the second wiring lines;

a contact formed in the peripheral area, the contact extending in a third direction perpendicular to the first and second directions; and a plurality of second dummy-wiring-line regions formed in a periphery of the contact, each second dummy-wiring-line region comprising a third dummy wiring line and a fourth dummy wiring line, the third dummy wiring line being formed in the same layer as the first wiring lines and the first dummy wiring line and disconnected from the first wiring lines, disconnected from the first dummy wiring line, and disconnected from other third dummy wiring lines of different second dummy-wiring-line regions, the fourth dummy wiring line being formed in the same layer as the second wiring lines and the second dummy wiring line and disconnected from the second wiring lines, disconnected from the second dummy wiring line, and disconnected from other fourth dummy wiring lines of different second dummy-wiring-line regions, and the second dummy-wiring-line regions are formed surrounding the periphery of the contact;

the third dummy wiring lines of different second dummy-wiring-line regions and the fourth dummy wiring lines of different second dummy-wiring-line regions are formed surrounding the periphery of the same respective contact.

2. The semiconductor memory device according to claim 1, wherein
each of the first and second dummy-wiring-line regions comprises a dummy cell having the same structure as the memory cell.

3. The semiconductor memory device according to claim 1, wherein
each second dummy-wiring-line region has a rectangular shape.

4. The semiconductor memory device according to claim 3, wherein
each of the first and second dummy-wiring-line regions comprises a dummy cell having the same structure as the memory cell.

5. A semiconductor memory device comprising:
a plurality of first wiring lines extending in a first direction;
a plurality of second wiring lines extending in a second direction crossing the first direction;
a memory cell array comprising memory cells, the memory cells being connected to the first wiring lines and the second wiring lines in crossing portions of the first and second wiring lines;
a contact formed in a peripheral area around the memory cell array, the contacts extending in a third direction perpendicular to the first and second directions; and
a plurality of dummy-wiring-line regions formed in a periphery of the contact,
each dummy-wiring-line region comprising a first dummy wiring line and a second dummy wiring line,
the first dummy wiring line being formed in the same layer as the first wiring lines and disconnected from the first wiring lines and from other first dummy wiring lines of different dummy-wiring-line regions,
the second dummy wiring line being formed in the same layer as the second wiring lines and disconnected from the second wiring lines and disconnected from other second dummy wiring lines of different dummy-wiring-line regions, the dummy-wiring-line regions are formed surrounding the periphery of the contact;
the first dummy wiring lines of different dummy-wiring-line regions and the second dummy wiring lines of different dummy-wiring-line regions are formed surrounding the periphery of the same respective contact.

6. The semiconductor memory device according to claim 5, wherein
each dummy-wiring line region has a rectangular shape.

7. The semiconductor memory device according to claim 5, wherein
each of the dummy-wiring-line regions comprises a dummy cell formed between the first dummy wiring line and the second dummy wiring line.

8. The semiconductor memory device according to claim 1, wherein
the plurality of the second dummy-wiring-line regions are arranged in a rectangular shape, and
the plurality of the second dummy-wiring-line regions are formed surrounding the periphery of the contact.

9. The semiconductor memory device according to claim 5, wherein
the plurality of the dummy-wiring-line regions are arranged in a rectangular shape, and
the plurality of the dummy-wiring-line regions are formed surrounding the periphery of the contact.

10. The semiconductor memory device according to claim 1, wherein
the plurality of the second dummy-wiring-line regions are arranged in an annular shape, and
the plurality of the second dummy-wiring-line regions are formed surrounding the periphery of the contact.

11. The semiconductor memory device according to claim 5, wherein
the plurality of the dummy-wiring-line regions are arranged in an annular shape, and
the plurality of the dummy-wiring-line regions are formed surrounding the periphery of the contact.

12. The semiconductor memory device according to claim 1, wherein
four second dummy-wiring-line regions are formed surrounding the periphery of the contact,
each of the four second dummy-wiring-line regions has a surface facing the contact, and
each of the four surfaces facing the contact is perpendicular to another or parallel to another.

13. The semiconductor memory device according to claim 5, wherein
four second dummy-wiring-line regions are formed surrounding the periphery of the contact,
each of the four second dummy-wiring-line regions has a surface facing the contact, and
each of the four surfaces facing the contact is perpendicular to another or parallel to another.

14. The semiconductor memory device according to claim 1, wherein
the second dummy-wiring-line regions are separated from the first dummy-wiring-line region in a plane perpendicular to the third direction, and
the second dummy-wiring-line regions are separated from each other in the plane.

15. The semiconductor memory device according to claim 5, wherein
the dummy-wiring-line regions are separated from each other in a plane perpendicular to the third direction.

* * * * *